(12) United States Patent
Suzuki

(10) Patent No.: US 6,379,871 B1
(45) Date of Patent: Apr. 30, 2002

(54) METHOD FOR FABRICATING A MASK FOR A LIGA PROCESS

(75) Inventor: Kenichiro Suzuki, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/329,907

(22) Filed: Jun. 10, 1999

(30) Foreign Application Priority Data

Jun. 10, 1998 (JP) .......................................... 10-161644

(51) Int. Cl.⁷ ................................................. G03F 7/00
(52) U.S. Cl. ......................... 430/315; 430/313; 427/96
(58) Field of Search ............................. 430/5, 311, 313, 430/315; 427/58, 96

(56) References Cited

U.S. PATENT DOCUMENTS

| | | | | |
|---|---|---|---|---|
| 4,080,267 A | * | 3/1978 | Castellani et al. ............. | 204/15 |
| 4,572,925 A | * | 2/1986 | Scarlett ...................... | 174/68.5 |
| 4,696,878 A | * | 9/1987 | Shimkunas ................... | 430/5 |
| 5,262,041 A | * | 11/1993 | Gulla .......................... | 205/125 |
| 5,298,687 A | * | 3/1994 | Rapoport et al. ............. | 174/261 |
| 5,378,583 A | * | 1/1995 | Guckel et al. ............... | 430/325 |
| 5,483,387 A | * | 1/1996 | Bauhahn et al. .............. | 359/885 |
| 5,496,668 A | * | 3/1996 | Guckel et al. ................. | 430/9 |
| 5,513,430 A | * | 5/1996 | Yanof et al. ................... | 29/846 |
| 5,645,977 A | * | 7/1997 | Wu et al. ..................... | 430/320 |
| 5,846,676 A | * | 12/1998 | Chiba et al. ................... | 430/5 |
| 6,049,650 A | * | 4/2000 | Jerman et al. ............... | 385/137 |
| 6,093,520 A | * | 7/2000 | Vladmirsky et al. ........ | 430/326 |
| 6,117,784 A | * | 9/2000 | Uzoh ......................... | 438/694 |
| 6,159,413 A | * | 12/2000 | Katoh et al. ................. | 264/447 |

FOREIGN PATENT DOCUMENTS

| | | |
|---|---|---|
| JP | 4-150026 | 5/1992 |
| JP | 4-184935 | 7/1992 |
| JP | 5-206125 | 8/1993 |
| JP | 7-263379 | 10/1995 |

* cited by examiner

Primary Examiner—Kathleen Duda
(74) Attorney, Agent, or Firm—Hutchins, Wheeler & Dittmar

(57) ABSTRACT

In a method for manufacturing a LIGA process mask, a plating-resistant layer is caused to intervene between a plating seed layer and a resist layer and patterning is performed of the resist layer.

14 Claims, 3 Drawing Sheets

METHOD FOR FABRICATING A MASK FOR A LIGA PROCESS

BACKGROUND OF THE INVENTION

1. Field of the Invention

The present invention relates to a method of fabrication a mask for a LIGA process, and more specifically it relates to a method of fabricating a LIGA process mask that solves the problem of faulty mask patterns caused by partial peeling of the resist material layer, and that can be used in the mass production of semiconductor devices.

2. Description of the Related Art

The LIGA process, which takes its name from the German express Lithographie (lithography) Galvanoformung (electroplating) Abformung (molding) makes use of a mask that is fabricated by electroplating and x-rays with superior linearity that are produced by a synchrotron to produce a pattern having an ultra-high aspect ratio using lithography.

This technology is currently the subject of active research in Europe and the U.S.

Because this process enables the fabrication of a pattern having an extremely high aspect ratio (width of 2 $\mu$m with a height of 100 $\mu$m or greater), it enables the fabrication of ultra-small optical components and components for motors, for example.

Using the LIGA process, when patterning the resist, a mask is used that is similar to the type of mask used in x-ray lithography in the past.

In the LIGA process, however, whereas x-ray lithography was completed with an exposure time of approximately 10 seconds, because the resist is very thick, the thickness being in the range from 0.1 to 1 mm, the exposure time usually exceeds 1 hour, the result being that the absorbent element of the mask needs to have a thickness of approximately 10 $\mu$m.

This is more than 10 times the thickness of the absorbent element in x-ray lithography, which is 1 $\mu$m or less thick.

Next, the method of fabricating a LIGA process mask will be described, with reference made to FIG. 2. First, as shown in FIG. 2(a), an oxide film 12 is formed on one surface of a silicon substrate 11 and a nitride film 13 having a thickness of approximately 2 $\mu$m is formed on the other surface thereof, and a plating seed layer 14 is formed on the nitride film 13 using, for example, deposition.

This plating seed layer 14 is formed by some type of electrically conductive material, such as by forming a chromium layer having a thickness of 100 Angstroms on the above-noted nitride film 13, and then laminating onto the chromium layer a metallic layer having a thickness of 2000 Angstroms.

Next, as shown in FIG. 2(b), a resist layer 15 having a thickness of 15 $\mu$m (is applied to the seed layer 14, and patterning is done by exposure to ultraviolet light, so as to form the hollow portion of the pattern for plating, after which the silicon substrate 11 is immersed in a gold plating solution and agitated, with a voltage applied to it that is negative with respect to the plating solution so that, as shown in FIG. 2(c), a gold plating layer 16 having a thickness of 10 $\mu$m, for example, is formed in the hollow parts of the plating pattern.

Next, after drying, resist peeling fluid is used to remove the resist 15, and an ion milling apparatus is used to remove the plating seed layer 14 that is not to be plated so that, as shown in FIG. 2(d), an absorbent element is formed from the lamination of the plating seed layer 14 and the gold plating layer 16.

Then, the oxide film 12 on the reverse surface is patterned, and the silicon substrate 11 is etched with this oxide film 12 used as a mask, thereby forming a nitride film membrane 17.

In the method of fabricating a LIGA process mask in the past, however, the following problems arise.

The first problem is that, with the shrinking of the hollow pattern size for plating, for example as shown in FIG. 3, parts 18 and 19 of the resist 15 peel away from the plating seed layer 14.

If gold plating is done in this condition, for example, gold will be deposited even in the peeled away parts 18 and 19 on the plating seed layer 14, resulting in a faulty mask pattern, the result being that the pattern fabricated by the LIGA is also faulty.

The second problem is that the large amount of gold that is used on the plating seed layer 14 causes a specific impurity potential to be imparted to the silicon substrate, the result being that, because this is a substance that is strictly controlled in a manufacturing process line for semiconductor devices, it was difficult in the past to make use of a LIGA process mask in the production of semiconductor devices.

The third problem is that, because when ultraviolet light is used for patterning of the resist 15, the height-to-width ratio (aspect ratio) of the plating hollow pattern that is formed was no more than 3 or 4, for a resist layer 15 having a thickness of 15 $\mu$m, for example, the minimum width of the pattern that is formed is approximately 4 $\mu$m.

The result of this was that it was not possible to apply the LIGA process to, for example, the case of patterning for an electrostatic micro-actuator, which develops a larger output the smaller is the spacing between two electrodes which apply a voltage, or to the case of manufacturing optical components for which alignment between a fiber and a laser must be made to a precision of 1 $\mu$m or better.

Therefore, there was an urgent need in this field for a solution to the above-described problems.

The Japanese Unexamined Patent Publication (KOKAI) No. 4-150026 discloses the provision of a protective film on a film to be processed, for the purpose of preventing the removal of the film to be processed by etching during the patterning of a resist film of a semiconductor device.

However, the substance used in the present invention resists plating is not for the purpose of preventing etching, but rather a material that is selected because of its own property of resisting plating.

In this respect, it is intrinsically different from the protective film noted in the Japanese Unexamined Patent Publication (KOKAI)No. 4-150026, nor could the present invention be easily conceived of from the contents of the Japanese Unexamined Patent Publication (KOKAI)No. 4-150026.

In the Japanese Unexamined Patent Publication (KOKAI) No. 7-263379, there is a disclosure of the LIGA process itself, and in the Japanese Unexamined Patent Publication (KOKAI)No. 5-206125, there is a disclosure of a method for patterning a multilayer resist of a semiconductor device, and neither of these discloses the essence of the present invention.

Accordingly, it is an object of the present invention to improve on the above-described drawbacks of the prior art, by providing a LIGA process mask manufacturing method that achieves a solution to the problem of faulty mask patterns due to partial peeling of resist, and which also is usable in a process for manufacturing a semiconductor device and capable of forming a mask pattern having a high aspect ratio.

SUMMARY OF THE INVENTION

In order to achieve the above-noted object, the present invention adopts the following basic technical constitution.

Specifically, an embodiment of the present invention is a method for manufacturing a LIGA process mask, this method including a step of forming a plating seed layer on a substrate, a step of forming a layer made of a substance that resists plating over said plating seed layer, a step of forming a layer of resist material over said plating-resistant layer, a step of patterning said resist layer and said plating-resistant layer so as to form a plating pattern thereon, a step of plating inside of said plating pattern so as to form a plating layer on said plating seed layer, and a step of removing said resist layer, said plating-resistant layer and a non-plated part of said plating seed layer.

A method for manufacturing a LIGA process mask according to the present invention adopts the above-noted technical constitution, a feature of which is the formation of a layer of plating-resistance substance over the plating seed layer, so that even in the event that part of the layer of partially cooled resist peels away, because the plating-resistant layer remains on this part of the plating seed layer, the deposition of the plating layer is prevented, thereby preventing the occurrence of a faulty mask.

Additionally, because of the formation of a plating-resistant layer over the plating seed layer, contamination of a semiconductor device manufacturing process line by gold or the like that forms the plating seed layer is prevented, thereby making it possible to form and pattern the layer of resist material on a semiconductor device manufacturing process line.

Additionally, in order to increase the aspect ratio of the plating pattern that is formed, in performing the patterning process for such a layer made of resist material, even if an oxygen plasma that is one of methods which have been used in the past in anisotropic resist layer patterning, is used in place of ultraviolet light, because the etching does not reach the plating seed layer, resulting in a change in the quality of the plating seed layer, it is sufficiently possible to use anisotropic etching.

In the case in which the plating in the present invention is gold plating, it is desirable that the plating-resistant substance used be a metallic nitride that either partially or completely resists plating, and the use of titanium nitride, which is often used in semiconductor device manufacturing processes is further preferable, since it enables the formation and patterning of the resist layer on a semiconductor device manufacturing process line.

In the present invention, the plating pattern which will be formed inside the resist layer is preferably a hollow configuration.

Another substance that can be used as plating-resistant substance is an electrical insulating material that either partially or completely resists electroplating.

Of such materials, if a silicon oxide, a silicon nitride, BPSG, TEOS or such inorganic or organic insulation film materials as used in semiconductor device manufacturing processes can be used, and the use of a silicon oxide or silicon nitride in particular is more preferable, since it enables the formation and patterning of the resist layer on a semiconductor device manufacturing process line.

When a semiconductor device manufacturing process line is used to form and pattern the resist material layer, because it is possible to use a resist material that is used in, for example, a two-layer or a three-layer resist, this presents an advantage, since the patterning of this resist material layer can be done by etching technology which makes use of semiconductor device manufacturing processes such oxygen plasma etching, and in particular anisotropic etching technology.

DESCRIPTION OF THE PREFERRED EMBODIMENTS

An embodiment of a method for manufacturing a LIGA process mask according to the present invention is described below, with references made to the accompanying drawing.

Figure 1:
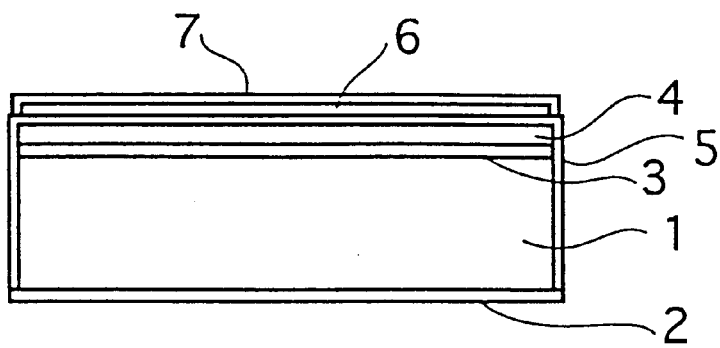
FIG. 1 is a set of cross-section views that illustrate an example of the processes in a method for manufacturing a LIGA process mask according to the present invention, FIG. 1(a) showing the condition in which the plating seed layer 6 and the plating-resistant layer 7 are formed, FIG. 1(b) showing the condition in which the plating hollow pattern is formed within the resist layer 8, FIG. 1(c) showing the condition in which the plating layer 9 is formed, and FIG. 1(d) showing the condition in which the membrane 10 is formed, thereby completing the LIGA process mask.
Figure 1:
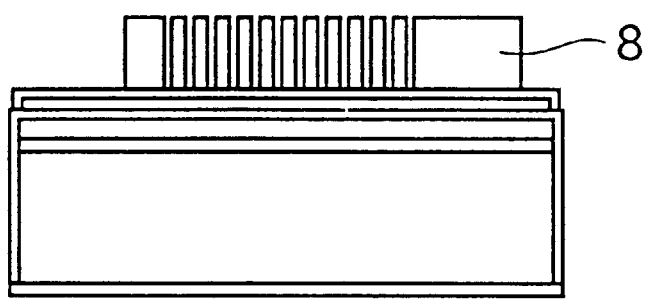
Figure 1:
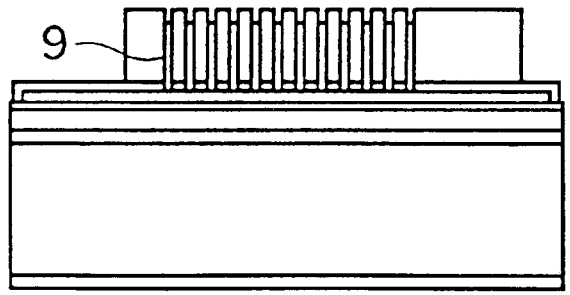
Figure 1:
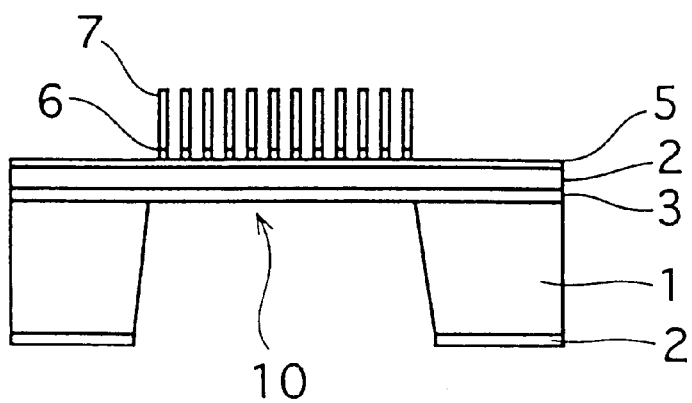
Figure 2:
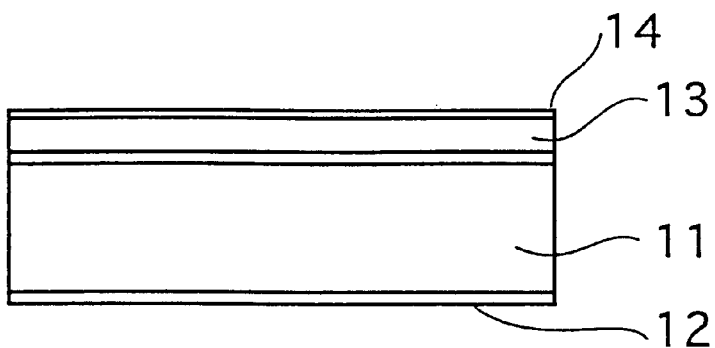
FIG. 2 is a set of cross-section views that illustrate the processes in a method for manufacturing a LIGA process mask according to the prior art, FIG. 2(a) showing the condition in which the plating seed layer 14 is formed, FIG. 2(b) showing the condition in which the plating hollow pattern is formed within the resist layer 15, FIG. 2(c) showing the condition in which the plating layer 16 is formed, and FIG. 2(d) showing the condition in which the membrane 17 is formed, thereby completing the LIGA process mask.
Figure 2:
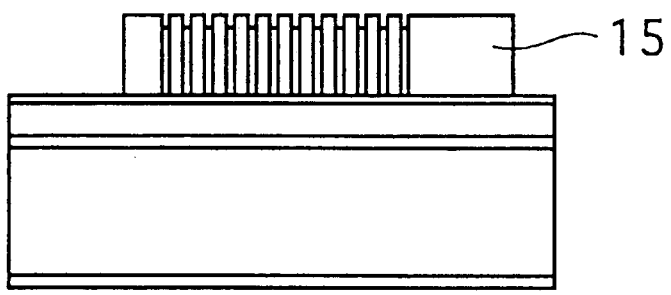
Figure 2:
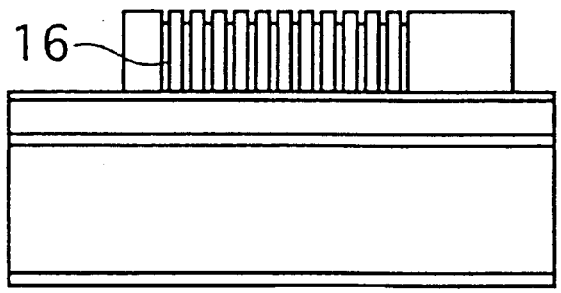
Figure 2:
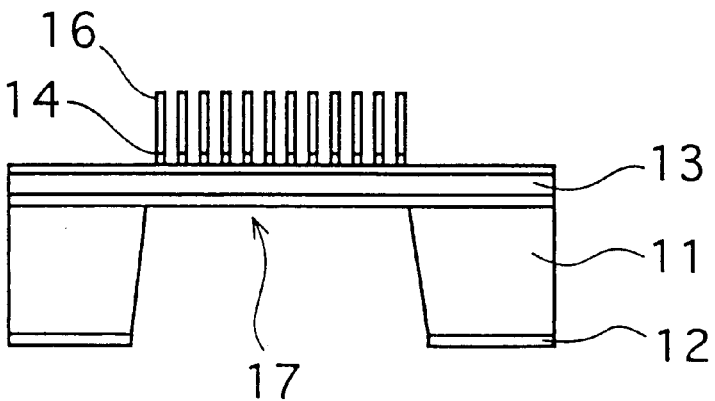
Figure 3:
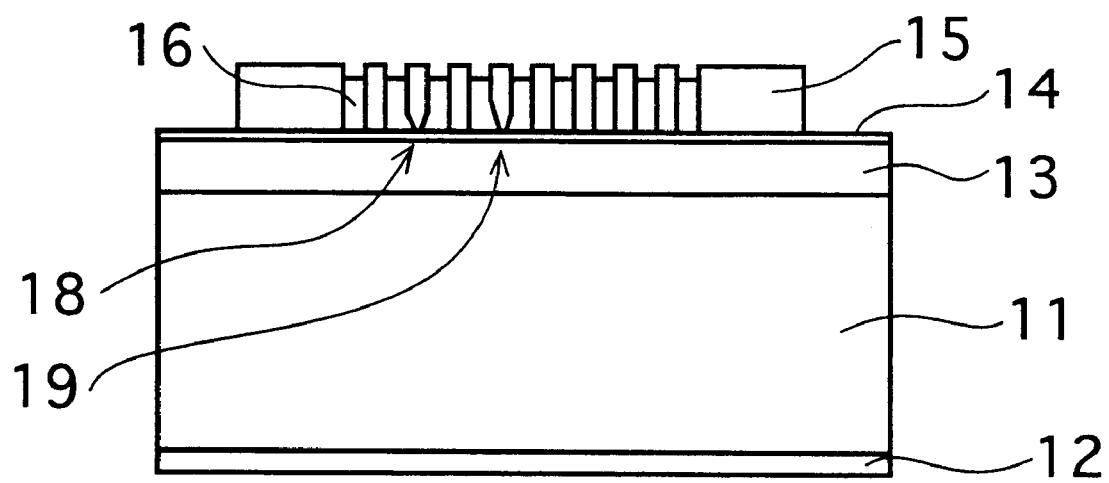
FIG. 3 is a cross-section view that is an enlarged view of FIG. 2(c), this showing the resist peeled parts 18 and 19 of in the method for manufacturing a LIGA process mask according to the prior art.

Specifically, FIG. 1 is a set of cross-section views that illustrate the manufacturing process steps in a method of manufacturing a LIGA process mask according to the present invention.

As shown in FIG. 1(a), a silicon oxide film 2 is formed over one surface of, for example, a silicon substrate 1, and on the other surface thereof, a silicon oxide film 3 is formed to a thickness of, for example, 0.3 $\mu$m.

On this silicon oxide film 3 is formed a polysilicon film 4 having a thickness of approximately 2 $\mu$m, after which a silicon oxide film 5 is used to cover entire silicon oxide film 4 and side surface of the substrate 1, this having a thickness of, for example, 0.2 $\mu$m.

The films 2, 3, 4, and 5 are provided for the purpose of protecting the substrate 1 and the purpose of improving the film growth, and it is possible to change the makeup thereof as needed.

Next, on the silicon oxide film 5 that was formed over one surface of the substrate 1, sputtering or the like is used to form an electrically conductive laminate of a chromium layer having a thickness of 300 Angstroms and a layer of gold or platinum having a thickness of 2000 Angstroms, thereby forming a laminated plating seed layer 6.

Then, on the plating seed layer 6, a plating-resistant layer 7, made of a substance such as titanium nitride, which resists plating, and having a thickness of 200 Angstroms, is formed, for example, by sputtering.

When this is done, the plating seed layer 6 is left with a width of several millimeters around the edge of the main surface of the substrate 1, after which layer 7, made of a material that resists plating is formed over the entire surface of the substrate 1, thereby causing the plating-resistant layer 7 to sufficiently hide the plating seed layer 6.

Next, as shown in FIG. 1(b), on the plating-resistant layer 7 a resist layer 8 is formed, using a multilayer resist material such as a three-layer resist material that is used in semiconductor device manufacturing processes, to a thickness of 15 $\mu$m, thereby forming the resist layer 8, and an appropriate mask, for example, is used to pattern the mask so as to form the hollow part thereof.

For example, if a three-layer resist layer with a thickness of 15 μm is used, it is possible to form a hollow part that has a width of 1 μm.

Although the three-layer resist is formed as a silicon oxide film intermediate layer that is sandwiched between a thick lower resist film and a thick upper resist film, in the present invention it is possible to have as the resist film 8 that forms the hollow parts a structure that has, in addition to the lower resist film, a intermediate and upper resist film, as shown in FIG. 1(c), which remain until the plating is completed, without any particular problems.

Next, using the resist layer 8 formed as described above as a mask, dry etching using a chlorine plasma, for example, or wet etching whereby the substrate 1 is immersed, for example, in a bath of ammonium hydroxide is used to etch the plating-resistant layer 7, thereby forming a plating hollow pattern within the hollow parts of the resist layer 8 and within the hollow parts of the plating-resistant layer 7.

When this is done, if anisotropic dry etching is done, even if there is bottom peeling, for example, from the resist material, because of the effect of the upper part of the layer 8, it is possible to perform patterning of the plating-resistant layer 7 to the desired shape.

Next, the substrate with the hollow pattern formed as described above is immersed in a gold plating solution and agitated, with a voltage applied to it that is negative with respect to the plating solution so that, as shown in FIG. 1(c), a gold plating layer 9, for example, is formed to the thickness of approximately 10 μm.

Then, after drying, a known resist peeling fluid is used to remove the resist layer 8, or etching or the like is used to remove the plating-resistant layer 7, made of titanium nitride or the like, after which an ion milling apparatus is used to removed the plating seed layer 6 that is not plated with the plating layer 9. Then, the oxide film 2 on the reverse side is patterned, after which the silicon substrate 1 is etched, thereby forming the membrane 10.

By adopting the above-described technical constitution, a method of manufacturing a LIGA process mask according to the present invention forms a plating-resistant layer on the plating seed layer, the result being that even in the event that part of the layer of partially cooled resist peels away, because the plating-resistant layer remains on this part of the plating seed layer, the deposition of the plating layer is prevented, thereby preventing the occurrence of a faulty mask, the ultimate effect of which is an improvement in process margin for fabricating a LIGA process mask and an improvement in yield.

Additionally, because of the formation of a plating-resistant layer over the plating seed layer, contamination of a semiconductor device manufacturing process line by gold or the like that forms the plating seed layer is prevented, thereby making it possible to form and pattern the layer of resist material on a semiconductor device manufacturing process line.

Additionally, in order to increase the aspect ratio of the plating hollow pattern that is formed, even if an oxygen plasma is used in place of ultraviolet light that has been used in the past in resist layer patterning using anisotropic etching, because the etching does not reach the plating seed layer, resulting in a change in the quality of the plating seed layer, it is sufficiently possible to use anisotropic etching.

The resulting effect is that, when a layer of resist having a thickness of 15 μm is used, it is possible to form a fine mask pattern feature of 1 μm or smaller, enabling application to the case of an electrostatic microactuator that develops a larger output, and the case of manufacturing optical components for which alignment between a fiber and a laser must be made to a precision of 1 μm or better.

What is claimed:

1. A method for manufacturing a LIGA process mask, said method comprising:
    a step of forming a plating seed layer on a substrate;
    a step of forming a plating-resistant layer made of a substance that resists plating disposed upon said plating seed layer;
    a step of forming a layer of resist material disposed upon said plating-resistant layer;
    a step of patterning said resist layer to form a patterned resist layer, and using said patterned resist layer to pattern said plating-resistant layer so as to form a plating pattern disposed upon said plating seed layer;
    a step of plating inside of said plating pattern so as to form a plated layer on said plating seed layer; and
    a step of removing said resist layer, said plating-resistant layer and a non-plated part of said plating seed layer.

2. The method for manufacturing a LIGA process mask according to claim 1, wherein said plated layer includes gold.

3. The method for manufacturing a LIGA process mask according to claim 1, wherein said substance that resists plating is a metal nitride.

4. The method for manufacturing a LIGA process mask according to claim 3, wherein said metal nitride is titanium nitride.

5. The method for manufacturing a LIGA process mask according to claim 1, wherein said substance that resists plating is an electrical insulating substance which resists electroplating.

6. The method for manufacturing a LIGA process mask according to claim 5, wherein said electrical insulating substance is an electrical insulation film material used in a semiconductor device manufacturing process.

7. The method for manufacturing a LIGA process mask according to claim 6, wherein said electrical insulting substance is one substance selected from the group consisting of silicon oxide and silicon nitride.

8. The method for manufacturing a LIGA process mask according to claim 1, wherein said resist material is a material used in a semiconductor device manufacturing process.

9. The method for manufacturing a LIGA process mask according to claim 8, wherein said resist material used in a semiconductor device manufacturing process is a multilayer resist.

10. The method for manufacturing a LIGA process mask according to claim 9, wherein said multilayer resist includes at least one layer of silicon oxide film.

11. The method for manufacturing a LIGA process mask according to claim 1, wherein patterning of said resist layer is performed using an oxygen plasma.

12. The method for manufacturing a LIGA process mask according to claim 1, wherein said patterning of said plating-resistant layer is performed using an etching method selected from the group consisting of a dry etching method using a chlorine plasma, and a wet etching method using an ammonium hydroxide solution.

13. The method for manufacturing a LIGA process mask according to claim 1, wherein said plating-resistant layer substantially covers the entirety of at least an exposed surface of said plating seed layer.

14. The method for manufacturing a LIGA process mask according to claim 1, wherein said step of forming a plating seed layer on a substrate is performed upon a substrate covered on at least one surface with at least one non-conductive layer of a material selected from a group consisting of silicon oxide and polysilicon.

* * * * *